(12) United States Patent
Boxman et al.

(10) Patent No.: US 6,706,157 B2
(45) Date of Patent: Mar. 16, 2004

(54) VACUUM ARC PLASMA GUN DEPOSITION SYSTEM

(75) Inventors: Raymond Reuven Boxman, Herzelia (IL); Samuel Goldsmith, Herzelia (IL); Yair David, Ramat Hasharon (IL)

(73) Assignee: TransArc Ltd., Netanya (IL)

( * ) Notice: Subject to any disclaimer, the term of this patent is extended or adjusted under 35 U.S.C. 154(b) by 0 days.

(21) Appl. No.: 10/138,583

(22) Filed: May 6, 2002

(65) Prior Publication Data

US 2003/0047444 A1 Mar. 13, 2003

Related U.S. Application Data

(60) Provisional application No. 60/318,312, filed on Sep. 12, 2001.

(51) Int. Cl.[7] .............................................. C23C 14/32
(52) U.S. Cl. .............................. 204/192.38; 204/298.41
(58) Field of Search ....................... 204/192.38, 298.41

(56) References Cited

U.S. PATENT DOCUMENTS

| | | | | |
|---|---|---|---|---|
| 4,032,744 A | * | 6/1977 | Coucher | 219/121.49 |
| 5,481,081 A | * | 1/1996 | Ikegaya et al. | 219/121.48 |
| 5,840,163 A | * | 11/1998 | Welty | 204/192.38 |
| 5,952,061 A | * | 9/1999 | Yoshida et al. | 427/580 |
| 6,026,763 A | * | 2/2000 | Kim et al. | 118/723 HC |

* cited by examiner

*Primary Examiner*—Steven H. VerSteeg (57) ABSTRACT

A vacuum arc plasma gun deposition system includes a cathode, several anode assemblies that define a plasma channel, a current source for causing electrical current to flow from the anode assemblies to the cathode, a mechanism for moving the anode axially to keep the active surface of the cathode substantially at a fixed position relative to the anode assemblies, mechanisms for moving the anode assemblies to keep the cross sectional size of the plasma channel substantially constant, a mechanism for cooling the cathode by conducting heat away from lateral surfaces of the cathode, and mechanisms for ensuring that a non-flat substrate is coated uniformly. The scope of the invention includes methods of making coated products by depositing coatings on substrates using this vacuum arc plasma gun deposition system, and the coated products so made.

26 Claims, 8 Drawing Sheets

VACUUM ARC PLASMA GUN DEPOSITION SYSTEM

This application claims the benefit of Provisional Application No. 60/318,312 filed on Sep. 12, 2001.

FIELD AND BACKGROUND OF THE INVENTION

The present invention relates to a vacuum arc plasma gun deposition system that can be used to coat relatively large substrates and that can be operated with satisfactory stability for extended periods of time.

Vacuum arc deposition is used to deposit thin films and coatings from a source electrode (usually the cathode) placed in a vacuum chamber and subjected to a high current electrical arc. In the most utilized mode, the electrical current naturally concentrates at minute areas on the cathode surface known as cathode spots, which are heated to very high temperatures. There is very intense local evaporation of the cathode material from the cathode spots. High current densities pass through the vapor emitted from the cathode spot, heating and ionizing the vapor, and thus the emitted vapor expands away from the cathode spot in the form of hypersonic plasma jets. In addition, the vacuum arc produces a spray of molten droplets or solid debris, known collectively as macroparticles. The macroparticles are generally undesirable.

In the 1870's A. Wright ("On the production of transparent metallic films by the electrical discharge in exhausted tubes", *Am. J. Sci. Arts* vol. 13 pp. 49–55 (1877); "On a new process for the electrical deposition of metals, and for constructing metal-covered glass specula", *Am. J. Sci. Arts* vol. 14 pp. 169–178 (1878)) described the application of what was apparently a pulsed vacuum arc to deposit coatings on glass, and described their visual properties. Thomas Alva Edison ("Art of plating one material with another", U.S. Pat. No. 526,147, 1894; "Process of duplicating phonograms", U.S. Pat. No. 484, 582, 1892) taught the use of a continuous vacuum arc to produce metal coatings, and their use in the process of duplicating phonograms.

Currently, vacuum arc deposition is widely practiced, in particular to deposit diamond-like carbon, TiN, TiCN, (Ti, Al)N, ZrN and other ceramic materials on cutting and forming tools, household hardware (e.g. door knobs, plumbing fixtures), surgical instruments and implants, and jewelry. In the most common "batch coater" type of configuration, one or more cathodes are mounted in a vacuum chamber and serve as vapor plasma sources. The chamber is periodically opened to remove coated workpieces, and to mount new workpieces for coatings. At these times it is convenient to replace expended cathodes with new ones, and to clean the chamber walls and other components of accumulated coatings and debris. Typical cycle times are on the order of a few hours, during which the arc is operated for only some fraction of the time. In these systems, the coatings will generally contain some degree of macroparticle inclusions.

As taught by Aksenov et al. (*Sov. J. Plasma Phys.* Vol. 4 p. 425; Pribory I Tekhnika Eksperimenta N5 (1978) p. 1416), macroparticles can be separated from the plasma jets by bending the plasma using a magnetic field around an obstacle that occludes any direct path between the cathode and the substrates. The most common form of obstacle is the walls of a curved duct. Alternatively, as described by S. Falabella and D. M. Sanders, *J. Vac. Sci. Technol. A* vol. 10 p. 394 (1992), the duct may be formed from straight tubular sections joined at an angle. Nevertheless, some macroparticles may rebound from the duct wall and eventually bounce along the duct and reach the substrate. Several inventions (J. Storer et al., *J. Appl. Phys.* vol. 66 p. 5245 (1989); R. P. Welty, U.S. Pat. No. 5,480,527) teach that macroparticle transmission may be reduced by corrugating the duct wall or by placing baffle plates in the duct to catch bouncing macroparticles.

Prior art vacuum arc deposition devices are well suited for laboratory studies and for batch coating operation, where there are ample opportunities to replace expended cathodes and to clean the system of accumulated debris. However, in certain applications, long-term stable operation is required. For example, in large flat glass coating plants, an alternative technology, magnetron sputtering, is widely employed, and continuous operation runs of two weeks are common. Stable operation over long periods requires maintaining an approximately constant cathode temperature, electrode geometry and duct geometry, in the face of cathode erosion on the one hand, and the accumulation of a coating on the anode and other surfaces on the other hand.

There is thus a widely recognized need for, and it would be highly advantageous to have, a vacuum arc plasma gun deposition system including mechanisms for stabilizing cathode temperature, electrode geometry and duct geometry.

SUMMARY OF THE INVENTION

It is an objective of the present invention to provide the means for stable, long duration, continuous vacuum arc deposition, by providing mechanisms for operating the cathode surface at a constant average temperature, and for maintaining approximately constant electrode and duct geometries in the face of cathode erosion and coating accumulation on other surfaces.

According to the present invention there is provided a vacuum arc plasma gun including: (a) a cathode having an active surface; (b) at least one anode; (c) a current source for causing electrical current to flow from the at least one anode to the active surface of the cathode; and (d) a mechanism for moving the cathode to keep the active surface substantially at a fixed position relative to the at least one anode while the electrical current flows.

According to the present invention there is provided a vacuum arc plasma gun including: (a) a cathode having an active surface and at least one lateral surface; (b) at least one anode; (c) a current source for causing electrical current to flow from the at least one anode to the active surface of the cathode; and (d) a mechanism for cooling the cathode while the electrical current flows, by conducting heat away from the at least one lateral surface.

According to the present invention there is provided a vacuum arc plasma gun including: (a) a cathode; (b) a plurality of anode assemblies defining a channel having a cross sectional size; (c) a current source for causing electrical current to flow from the plurality of anode assemblies to the cathode, thereby causing material to flow away from the cathode via the channel, at least a portion of the material then being deposited on the anode assemblies; and (d) for each anode assembly: a mechanism for moving the each anode assembly to keep the cross sectional size of the channel substantially constant while the material is deposited on the each anode assembly.

According to the present invention there is provided a method of coating a substrate, including the steps of: (a) providing a vacuum arc plasma gun including: (i) a cathode having an active surface, and (ii) at least one anode; (b) causing an electrical current to flow from the at least one anode to the active surface of the cathode, thereby creating a plasma that carries coating material away from the active surface of the cathode; and (c) while the electrical current flows: (i) positioning the substrate relative to the plasma so that at least a portion of the coating material is deposited on the substrate, and (ii) moving the cathode so that the active surface remains substantially in a fixed position relative to the at least one anode.

According to the present invention there is provided a method of coating a substrate, including: (a) providing a vacuum arc plasma gun including: (i) a cathode having an active surface and a lateral surface, and (ii) at least one anode; (b) causing an electrical current to flow from the at least one anode to the active surface of the cathode, thereby creating a plasma that carries coating material away from the active surface of the cathode; and (c) while the electrical current flows: (i) positioning the substrate relative to the plasma so that at least a portion of the coating material is deposited on the substrate, and (ii) removing heat from the cathode by conduction via the lateral surface.

According to the present invention there is provided a method of coating a substrate including: (a) providing a vacuum arc plasma gun including: (i) a cathode, and (ii) a plurality of anode assemblies defining a channel having a cross sectional size; (b) causing an electrical current to flow from the anode assemblies to the cathode, thereby creating a plasma that carries coating material away from the cathode via the channel, a first portion of the coating material being deposited on the anode assemblies; and (c) while the electrical current flows: (i) positioning the substrate relative to the plasma so that a second portion of the coating material is deposited on the substrate, and (ii) moving the anode assemblies to keep the cross sectional size of the channel substantially constant while the first portion of the coating material is deposited on the anode assemblies.

According to the present invention there is provided a vacuum arc plasma gun deposition system for coating a substrate, including: (a) a cathode; (b) at least one anode; (c) a current source for causing electrical current to flow from the at least one anode to the cathode, thereby forming a plasma that flows in a generally axial direction; and (d) a processing section including: (i) a mechanism for moving the substrate substantially perpendicular to the generally axial direction, and (ii) a mechanism for steering the plasma to flow at an angle to the generally axial direction within the processing section.

According to the present invention there is provided a method of coating a substrate, including: (a) providing a vacuum arc plasma gun including: (i) a cathode, and (ii) at least one anode; (b) causing an electrical current to flow from the at least one anode to the cathode, thereby creating a plasma that carries coating material away from the cathode; and (c) while the electrical current flows: (i) moving the substrate past the plasma so that at least a portion of the coating material is deposited on the substrate, and (ii) varying a rate of the flow of the electrical current to vary a rate at which the at least portion of the coating material is deposited on the substrate.

According to the present invention there is provided a method of coating a substrate, including: (a) providing a vacuum arc plasma gun including: (i) a cathode, (ii) at least one anode, and (iii) a processing section; (b) causing an electrical current to flow from the at least one anode to the cathode, thereby creating a plasma that flows into the processing section in a generally axial direction; and (c) while the electrical current flows: (i) moving the substrate within the processing section in a direction substantially perpendicular to the generally axial direction; and (ii) steering the plasma to impinge on the substrate at an angle to the generally axial direction.

The present invention includes four improvements over the prior art.

The first improvement is the provision of a mechanism for moving the cathode so as to keep the active surface of the cathode (i.e., the surface from which the plasma is emitted) at a fixed position relative to the anodes. The cathode is slowly moved axially towards the anodes as cathode material is emitted from the active surface. To stabilize the active surface, the active surface is provided with rounded or chamfered edges.

The second improvement is the provision of a mechanism for cooling the cathode by conducting heat away from the lateral surfaces of the cathode. To enable the cathode to be moved as necessary, this mechanism preferably includes one or more cooling bars that are reversibly urged against respective lateral sides of the cathode. Each cooling bar includes a heat sink and a coolant pipe through which a liquid coolant is circulated to cool the heat sink. An electrically insulating layer, preferably made of either a ceramic or an elastomer, is provided on the side of the heat sink that contacts the cathode. Another electrically insulating layer is provided on the side of the heat sink that faces the anodes.

The third improvement is the provision of anode assemblies that include, in addition to the anodes, respective mechanisms for moving the anodes primarily in an outward direction so that as cathode material is deposited on the anodes, the cross sectional size of the channel defined by the anode assemblies remains substantially constant. Preferably, each anode assembly includes a disposable plate, reversibly mounted on the anode and facing the channel, on which the cathode material accumulates. Most preferably, the disposable plates are made of the same material as the cathode. Preferably, each anode assembly also includes a coolant pipe through which a liquid coolant is circulated to cool the anode.

The fourth improvement is the provision of mechanisms for ensuring that a substrate that is not flat is coated uniformly as the substrate is moved at a constant rate past the plasma. One such mechanism includes one or more coils that steer the plasma to impinge locally perpendicularly on the substrate. The other mechanism involves suitable variation of the current that flows from the anode to the cathode.

The scope of the present invention also includes corresponding methods of using the vacuum arc plasma gun and the vacuum arc plasma gun deposition system of the present invention to coat a substrate, and coated products made by coating substrates using these methods. Among these products are coated architectural glass panes and covers for solar energy collectors.

A vacuum arc plasma gun deposition system of the present invention can operate continuously for at least 24 hours, and often as long as two weeks. This is in contrast to prior art systems, which generally can operate continuously for only up to a few hours.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a vacuum arc plasma gun deposition system that can be used to coat relatively large substrates and that can be operated with satisfactory stability for extended periods of time. Specifically, the present invention can be operated continuously to coat relatively large substrates such as plate glass.

Figure 1:
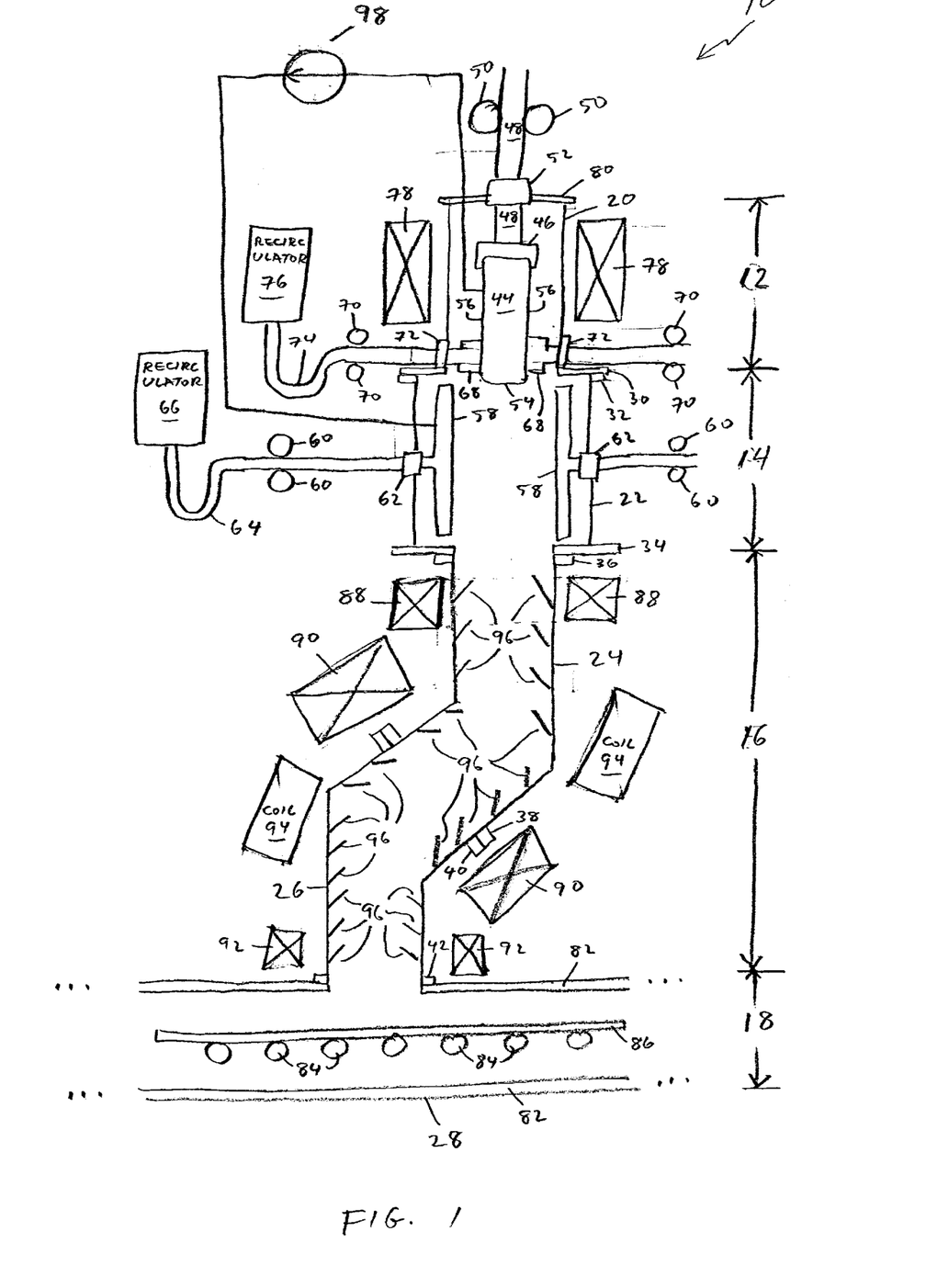
FIG. 1 is a partly schematic illustration of a vacuum arc plasma gun deposition system of the present invention in axial cross section.

The principles and operation of a vacuum arc plasma gun deposition system according to the present invention may be better understood with reference to the drawings and the accompanying description. Referring now to the drawings, FIG. 1 is a partly schematic illustration of a vacuum arc plasma gun deposition system 10 of the present invention in axial cross section. Vacuum arc plasma gun deposition system 10 includes four sections: a cathode section 12, an anode section 14, a filter duct section 16 and a processing section 18. Cathode section 12 includes a housing 20. At the axial ends of cathode section housing 20 are two flanges 80 and 30. Anode section 14 includes a housing 22. At the axial ends of anode section 14 are two flanges 32 and 34. Filter duct section 16 includes two housings, a first filter duct section housing 24 and a second filter duct section housing 26. At the axial ends of first filter duct section housing 24 are two flanges 36 and 38. At the axial ends of second filter duct section housing 26 are two flanges 40 and 42. Processing section 18 is bounded by walls 82, which include a lower wall 28. Cathode section flange 30 is reversibly mated, in a vacuum-tight manner, to anode section flange 32 by conventional means, for example by means of an o-ring gasket and suitable bolts (not shown). Similarly, anode section flange 34 is reversibly mated to first filter duct section flange 36 in a vacuum-tight manner, first filter duct section flange 38 is reversibly mated to second filter duct section flange 40 in a vacuum tight manner, and second filter duct section flange 42 is reversibly mated to the upper wall 82 of processing section 18 in a vacuum tight manner. The reversible connections of sections 12, 14, 16 and 18 allows the convenient disassembly and reassembly of vacuum arc plasma gun deposition system 10 for cleaning and for replenishing expended cathode material.

The combination of cathode section 12 and anode section 14 constitutes a plasma gun. The combination of cathode section 12, anode section 14 and filter duct section 16 constitutes a plasma source.

That FIG. 1 is in axial cross section is not to be construed to mean that vacuum arc plasma gun deposition system 10 is radially symmetric. In fact, it is preferable that sections 12, 14, 16 and 18 all be of rectangular cross section in a horizontal plane perpendicular to the plane of FIG. 1, and furthermore that sections 12, 14, 16 and 18 all be much longer, in this horizontal plane, in the direction perpendicular to the plane of FIG. 1 than in the direction parallel to the plane of FIG. 1.

Cathode section 12 houses a cathode assembly that includes a cathode 44 that is clamped to a cathode rod 48 by a cathode clamp 46. Cathode rod 48 emerges axially from cathode section 12 via a seal 52 in flange 80. Cathode rod 48 is moved axially through seal 52 by a mechanism represented schematically in FIG. 1 by rollers 50. This axial movement of cathode rod 48 is transferred to cathode 44 via clamp 46, so that mechanism 50 serves to move cathode 44 axially within cathode section 12. Cathode section 12 is surrounded laterally by a coil 78 whose function is discussed below in connection with FIGS. 2A, 2B and 2C.

Cathode section 12 also houses two cooling bars 68 that emerge transversely from cathode section 12 via respective seals 72 in cathode section housing 20. Respective mechanisms, represented schematically in FIG. 1 by rollers 70, are used to move cooling bars 68 transversely to contact respective lateral sides 56 of cathode 44. The detailed structure and function of cooling bars 68 are discussed below in connection with FIG. 3, as are the parts designated by reference numerals 74 and 76.

Anode section 14 houses two anode assemblies 58 that emerge transversely from anode section 14 via respective seals 62 in anode section housing 22. Respective mechanisms, represented schematically in FIG. 1 by rollers 60, are used to move anode assemblies 58 transversely within anode section 14. The detailed structure and function of anode assemblies 58 are discussed below in connection with FIG. 3, as are the parts designated by reference numerals 64 and 66.

Seals 52, 62 and 72 are conventional vacuum seals that permit motion perpendicular to the respective walls (flange 80 for seal 52, the side walls of anode section housing 22 for seals 62, the side walls of cathode section housing 20 for seals 72), for example Wilson seals.

A current source 98 provides electrical current that flows from anode assemblies 58 to an active surface 54 of cathode 44 via an electrical arc discharge. (The sign convention used herein is that electrical current flows from positive to negative; the actual charge carriers are, primarily, electrons that flow from cathode 44 to anode assemblies 58.) The electrical arc is established by a conventional mechanism, for example by bringing a trigger electrode (not shown), that is connected to the positive terminal of current source 98, into momentary contact with active surface 54 of cathode 44. This establishes cathode spots, on active surface 54, from which emerge jets of plasma. Anode assemblies 58 are positioned to intercept a small part of the plasma, allowing electrons from the plasma to reach anode assemblies 58 to complete the electric arc circuit. The rest of the plasma is guided by main coils 88, 90 and 92 and by steering coils 94 to impinge on a workpiece 86 in processing section 18, thereby coating workpiece 86 with coating material carried by the plasma. Baffles 96 in filter duct section 16 trap macroparticles that are carried by the plasma. Preferably, baffles 96 are mounted on frames (not shown) that can be removed from filler duct section 16 for cleaning during periodic maintenance. A suitable mechanism in processing section 18, represented schematically in FIG. 1 by rollers 84, moves workpiece 86 transversely past the plasma emerging from filter duct section 16 to achieve uniform coating of workpiece 86. Preferably, cathode 44 is rectangular in cross section, in a plane perpendicular to the plane of FIG. 1 that intersects the plane of FIG. 1 horizontally. Preferably, cathode 44 is much longer in the direction perpendicular to the plane of FIG. 1 than the width of workpiece 86 in the direction perpendicular to the plane of FIG. 1.

Figure 2A:
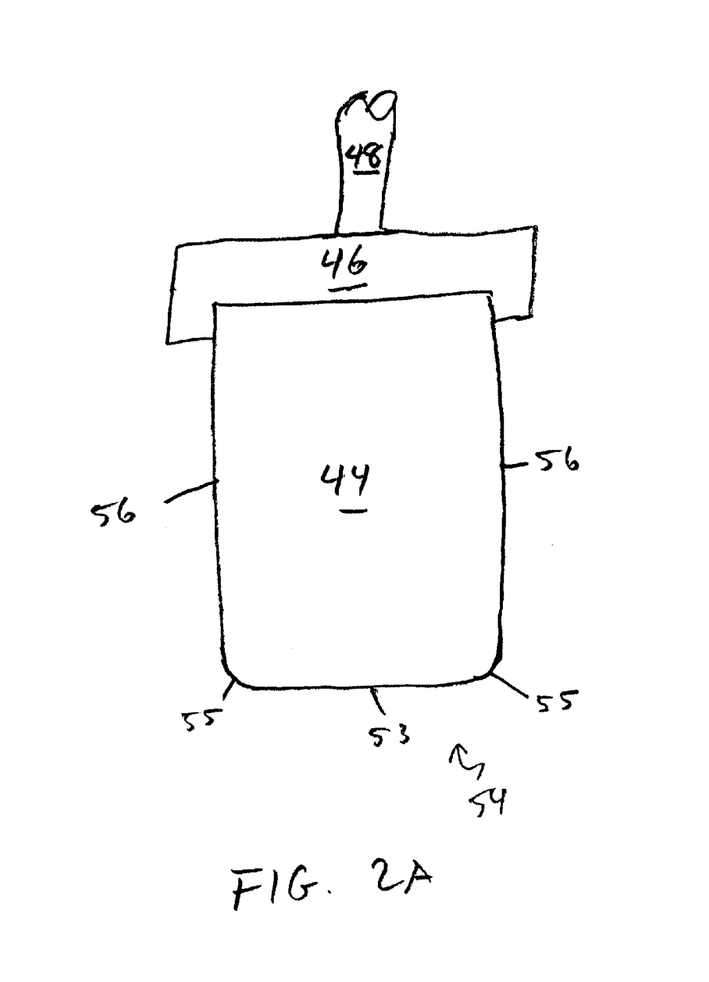
FIGS. 2A, 2B and 2C show three different cathode geometries.
Figure 2B:
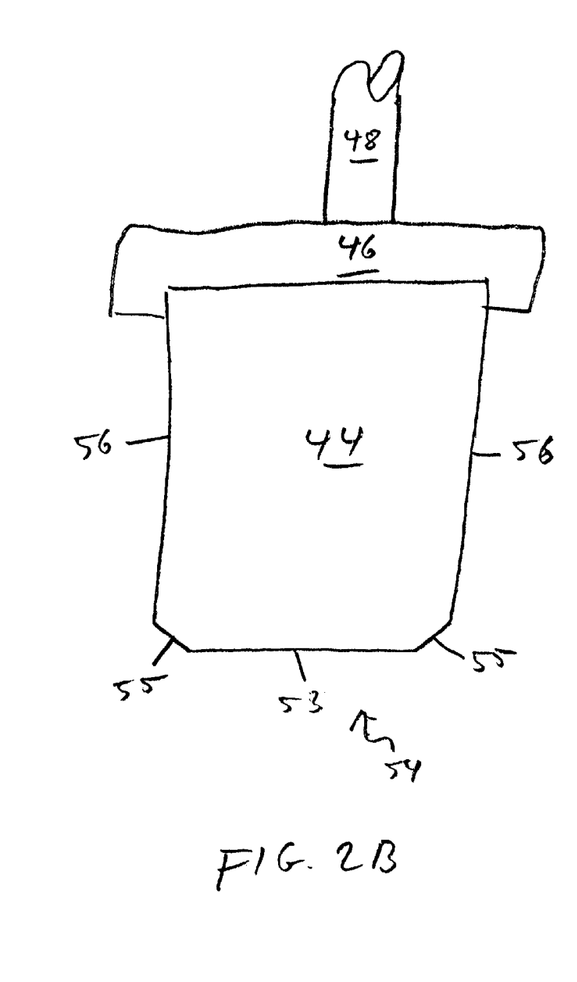
Figure 2C:
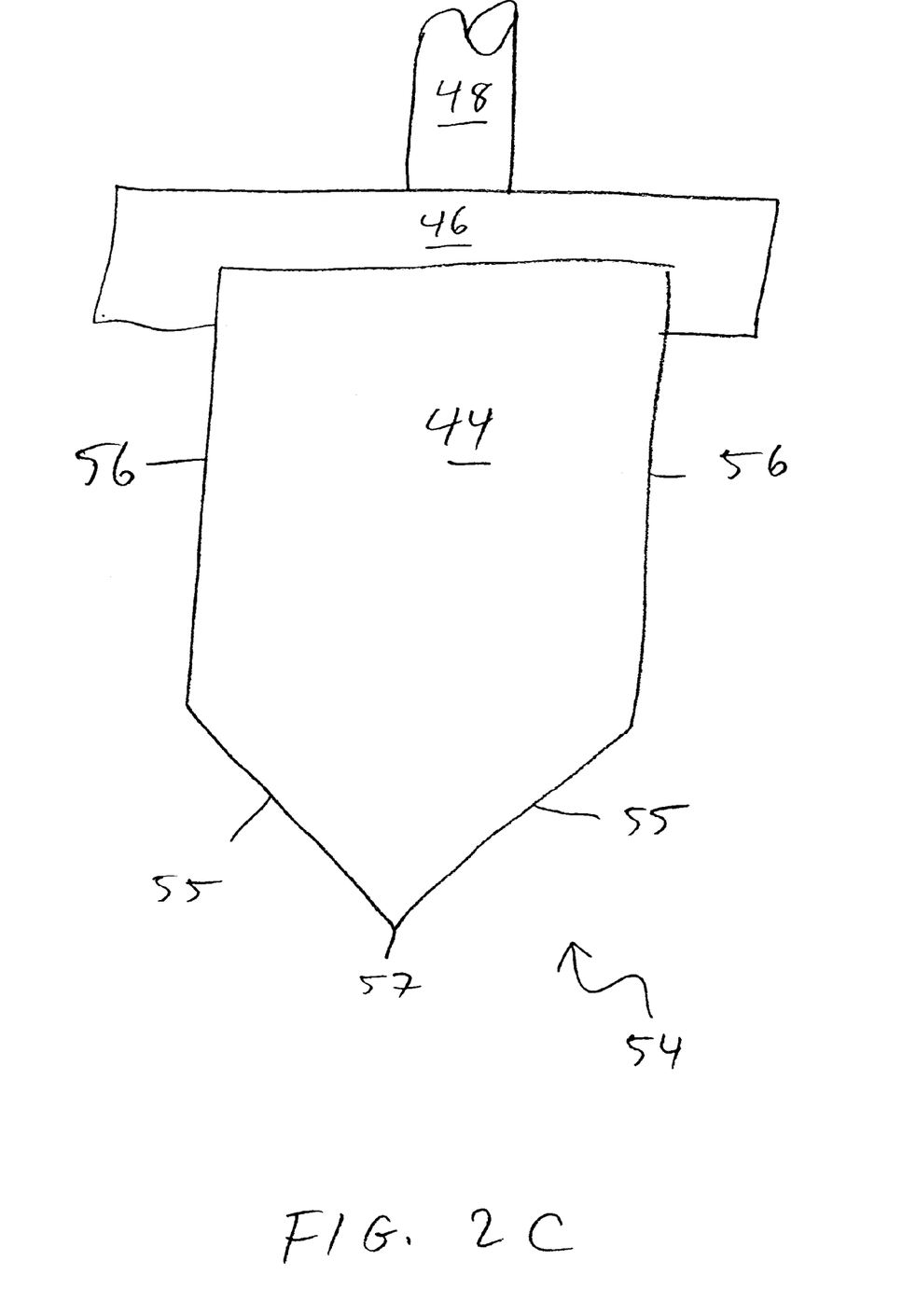

FIGS. 2A, 2B and 2C are close-up views of cathode 44 in the plane of FIG. 1, showing three alternative initial geometries for cathode 44. In the geometries of FIGS. 2A and 2B, active surface 54 includes a substantially flat central portion 53. The two geometries differ in the shapes of edges 55 of active surface 54, where active surface 54 contacts lateral surfaces 56. In FIG. 2A, edges 55 are rounded. In FIG. 2B, edges 55 are chamfered. The geometry of FIG. 2C has relatively large chamfered edges 55 and lacks a flat central portion. Instead, chamfered edges 55 meet at a point 57.

A key consideration in the design of vacuum arc plasma gun deposition system 10 is the control of the position and motion of cathode spots. Preferably the cathode spots are confined to active surface 54, such that the plasma emitted therefrom can readily reach workpiece 86. Likewise it is desirable to prevent cathode spot activity from occurring on other surfaces, such as lateral surfaces 56, where the plasma emission would be wasted, and where the plasma emission could damage parts which are not intended to support arcing and arc erosion. To this end, coils 78 and 88 are used to generate a generally axial magnetic field. Being axial, this magnetic field is generally oriented normal to the center of active surface 54. Cathode spots located on curved or chamfered edges 55 of active cathode surface 54 thus experience a magnetic field that intercepts edges 55 at an angle. A cathode spot continually extinguishes and re-ignites at adjacent locations, such that the cathode spot appears to move. In the absence of a magnetic field, the apparent motion is random. However in the presence of a magnetic field, the cathode spots primarily tend to move in the "retrograde" direction, i.e. in the direction defined by the component of the vector—J×B which is parallel to surface of the cathode, where J is the electrical current flux vector, and B is the magnetic field vector, and thus in the direction perpendicular to the plane of FIG. 1. In addition, there is a secondary tendency according to the "acute angle rule" for cathode spots to drift in the direction of the opening of the acute angle between the field line and the cathode surface, and thus towards the center of active surface 54. This is true for all three geometries illustrated in FIGS. 2A, 2B and 2C. Note that if the curvature of cathode 44 were such that there was a concave depression in the center of active surface 54, then, according to the acute angle rule, cathode spots located in the depression would tend to drift towards the rim of the depression. In general, cathode spots on an uneven surface subjected to a magnetic field generally perpendicular to the surface tend to drift to elevated regions, thus providing a mechanism for evening the arc erosion on a surface. In prior art cathodes, these principles have been applied to round rod cathodes with a truncated cone extremity forming the active surface, while in a preferred embodiment of the present invention these principles are applied to a rectangular cathode 44.

Coil 78, along with coil 88, also contributes to the guiding of the plasma towards workpiece 86, as described above. It is important to have a strong magnetic field perpendicular to central portion 53 of active surface 54, for two reasons. First, a strong magnetic field perpendicular to central portion 53 assures that the cathode spots on edges 55 move periodically and so move over the length of active surface 54 in the direction perpendicular to the plane of FIG. 1, resulting in a uniform coating of workpiece 86. Second, a strong magnetic field perpendicular to central portion 53 decreases the loss of plasma ions to anode assemblies 58 and so increases the flux of plasma ions to filter duct section 16.

As vacuum arc plasma gun deposition system 10 operates, cathode 44 is consumed by arc erosion. As arc erosion progresses, cathode 44 reaches an equilibrium shape that is determined by the material of cathode 44, the spacing of electrodes 44 and 58, and the magnetic field generated by coils 78 and 88.

In applications requiring a long continuous run time, cathode 44 must be sufficiently long, in the axial direction, to last for the entire run. For a 50 millimeter wide titanium cathode 44 operating with a current of 2 kA per meter length in the direction perpendicular to the plane of FIG. 1, cathode 44 should have an axial length of at least 50 centimeters.

In addition, during arc erosion, active surface 54 withdraws from anode assemblies 58. To keep active surface 54 fixed in position with respect to anode assemblies 58, mechanism 50 is used to move cathode rod 48, and so cathode 44, continuously or intermittently, in the direction of anode assemblies 58.

Figure 3:
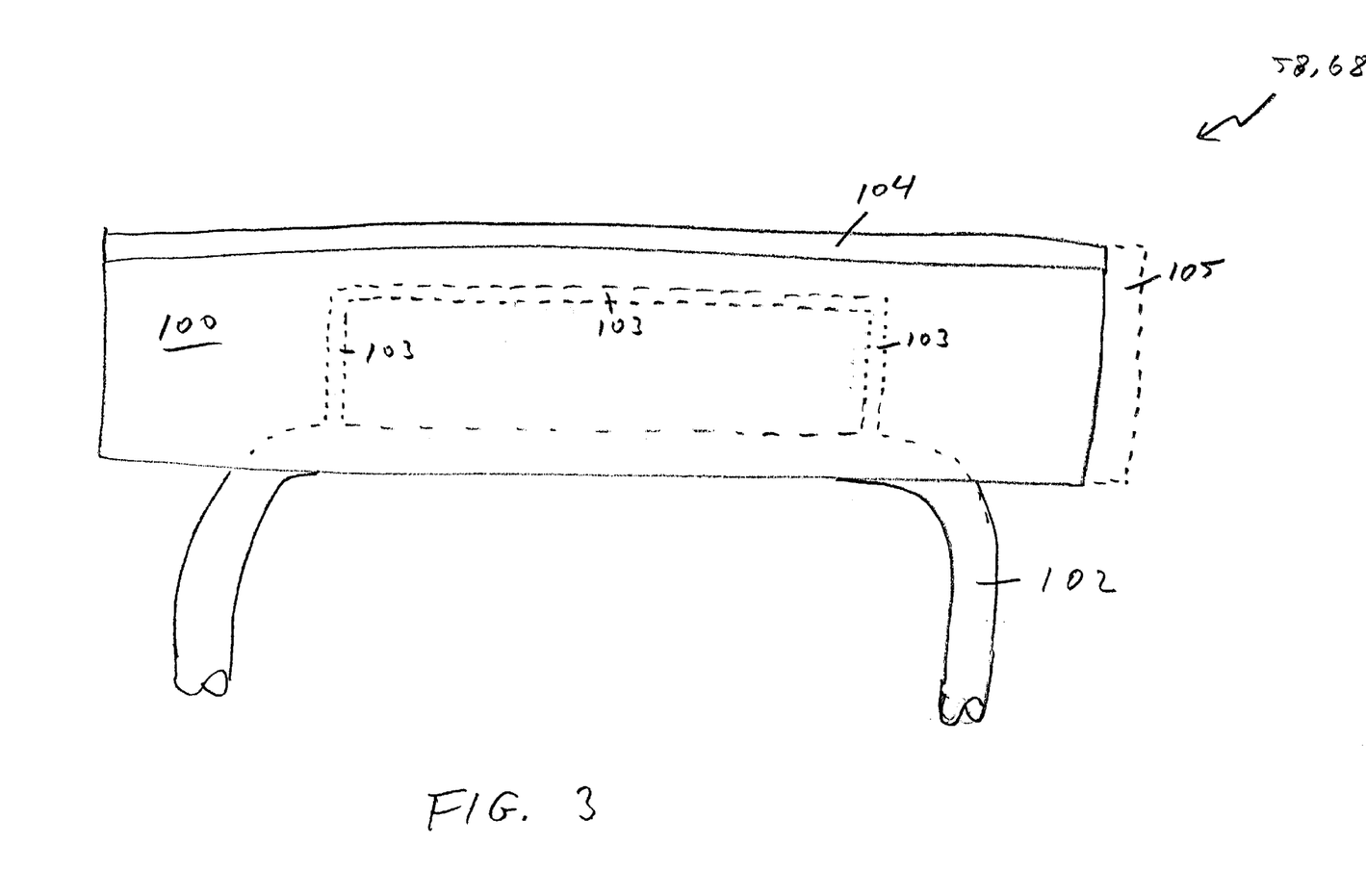
FIG. 3 is a combined illustration of the structures of cooling bars and anode assemblies.

FIG. 3 serves to illustrate both a cooling bar 68 and an anode assembly 58. Part 58 or 68 illustrated in FIG. 3 includes a substantially parallelopipedal body 100, a coolant pipe 102 and a plate 104. Plate 104 is in intimate thermal contact with body 100. Preferably, coolant pipe 102 is secured in a channel of semicircular cross-section on the side of body 100 opposite plate 104 and also is in intimate thermal contact with body 100. In terms of orientation, the horizontal direction in FIG. 3 is the direction perpendicular to the plane of FIG. 1 and the vertical direction in FIG. 3 is the horizontal direction in FIG. 1. Preferably, coolant pipe 102 is supplemented by additional coolant channels 103 within body 100 and in communication with coolant pipe 102. Some of coolant channels 103, as well as the portion of coolant pipe 102 that is embedded within the side channel, are shown in phantom in FIG. 3.

In a cooling bar 68, body 100 is a heat sink made of a good thermal conductor such as copper or aluminum, and plate 104 is a layer of an electrical insulator that also is a good thermal conductor. Rollers 70 engage coolant pipe 102 to move cooling bar 68 alternately in contact with and away from a corresponding lateral surface 56 of cathode 44 to cool cathode 44, as described below. The continuations 74 (FIG. 1) of coolant pipe 102 of a cooling bar 68 are flexible, and lead to a recirculator mechanism 76 (FIG. 1) that circulates a liquid coolant such as water through coolant pipe 102 while cooling the hot liquid coolant that emerges from heat sink 100. For illustrational clarity, only one of the two continuations 74 and only one of the two recirculator mechanisms 76 is shown in FIG. 1. Recirculator mechanism 76 is conventional, and could include, for example, a pump and a heat exchanger.

In an anode assembly 58, body 100 is an electrically conducting anode. Plate 104 also is electrically conducting, and is reversibly secured to anode 100, as described below. Rollers 60 engage coolant pipe 102 to move anode assembly 58 in a manner analogous to the movement of cooling bars 68, except that, as discussed below, during a production run, rollers 60 generally move anode assembly 58 in only one direction: away from the plasma. (As described below, this unidirectional movement can be modified to compensate for nonuniform buildup of coating on anode assemblies 58.) The continuations 64 (FIG. 1) of coolant pipe 102 of an anode assembly 58 are flexible, and lead to a recirculator mechanism 66 (FIG. 1) whose structure and function is identical to that of recirculator mechanism 76. For illustrational clarity, only one of the two continuations 64 and only one of the two recirculator mechanisms 66 is shown in FIG. 1.

Alternatively, in both cooling bars 68 and anode assemblies 58, the hot liquid coolant emerging from heat sinks 100 or from anodes 100 is discarded rather than being cooled and recirculated.

The purpose of cooling bars 68 is to remove heat from cathode 44. The net heating rate of cathode 44 may be estimated as $IV_c$, where I is the arc current and $V_c$ is an effective heating potential. $V_c$ typically is around 6 volts, so with the 2 kA per meter current noted above, approximately 12 kW of heat power per meter length of cathode 44 must be removed. In prior art vacuum arc plasma guns, heat is removed by direct water cooling of the cathode, or indirectly by mounting the cathode on a water-cooled heat sink. In either case, the distance from the active surface to the water-cooled surface changes over time as the cathode erodes. This changes the average active surface temperature and can cause variations in the cathode spot characteristics and hence in the plasma characteristics. Therefore, according to the present invention, cathode 44 is cooled by pressing cooling bars 68 against lateral surfaces 56 of cathode 44. Periodically, cooling bars 68 are withdrawn from cathode 44 to allow cathode 44 to be moved towards anode assemblies 58 as described above. Because the distance from active surface 54 to the portions of lateral surfaces 56 that are involved in cooling cathode 44 remains substantially constant, the temperature of active surface 54 also remains substantially constant.

In one variant of cooling bar 68, insulating layer 104 is made of a ceramic such as aluminum nitride or aluminum oxide. In another variant of cooling bar 68, insulating layer 104 is made of an elastomer with a high thermal conductivity. Such elastomers are available commercially from several manufacturers. One such elastomer is the Pink series 86/53 elastomer available from the Thermal Products Division of MM&W International Corp., Mahwah N.J. USA, and typically are fabricated by adding high conductivity ceramic powder particles to an elastomer polymer. The advantage of an elastomer over a rigid ceramic is that two rigid bodies, when pressed together, actually contact each other at only a few discrete locations, depending on the surface finish and mutual conformity of the matching surfaces, and on local elastic or plastic deformation of the contact points. Thus, the effective contact area is only a small fraction of the macroscopic contact area, and heat transfer between the two bodies may be limited by a thermal contact impedance. By contrast, an insulating layer 104 made of an insulating elastomer deforms elastically to fill microscopic voids in the corresponding lateral surface 56 and in the surface of heat sink 100 to which insulating layer 104 is attached, thereby increasing the effective contact area of cooling bar 68 with cathode 44 and decreasing the thermal contact impedance.

Preferably, another insulating layer 105, similar to insulating layer 104, is bonded to the surface of heat sink 100 that faces anode section 14. Insulating layer 105 is shown in phantom in FIG. 3 because insulating layer 105 is part of a cooling bar 68 but not part of an anode assembly 58. The purpose of insulating layer 105 is to discourage the propagation of cathode spots away from active surface 54, as a cathode spot cannot sustain itself on an insulator for a long time. Nevertheless, if insulating layer 105 becomes coated with cathode material that forms a conductive bridge to the cathode, cathode spots may exist temporarily on insulating layer 105 until the deposited cathode material evaporates.

Anode assemblies 58 are constructed to address the problem of cathode material buildup on vacuum arc plasma gun anodes. Some portion of the plasma emitted from the cathode of a vacuum arc plasma gun, as well as macroparticles, is intercepted by the anode, and electrons from the plasma complete the electrical circuit. In previous art vacuum arc plasma guns, the material intercepted by the anode forms a coating, whose thickness increases with time, until periodically removed during scheduled cleaning periods. If the coating is not removed, the coating thickness on the anode continues to increase. Depending on the anode geometry, the coating can eventually influence the arc voltage, or obstruct the passage of plasma to the workpiece, leading to a drift in the process or coating properties with time.

According to the present invention, the anodes are not static, but rather can be moved. Specifically, anode assemblies 58 are symmetrically disposed along the axis of vacuum arc plasma gun deposition system 10, defining a channel through which plasma flows towards filter duct section 16. As coating is built up on anode assemblies 58, anode assemblies 58 are withdrawn away from the axis, in order to maintain an approximately constant cross sectional size of the channel. If the accumulated coating on an anode assembly 58 is not uniform in the direction perpendicular to the plane of FIG. 1, one side of this anode assembly 58 can be withdrawn away from the axis at a different rate than the other side, thereby tilting this anode assembly 58 to compensate for the nonuniformity. Optionally, a mechanism (not shown in FIG. 1) is provided for pivoting anode 100 about coolant pipe 102, so that if the accumulated coating on an anode assembly 58 is not uniform in the plane of FIG. 1, this anode assembly can be tilted within the plane of FIG. 1. Under this option, the connections between coolant pipe 102 and coolant channels 103 must be flexible.

As noted above, plate 104 of anode assembly 58 is reversibly secured to anode 100, so as to be disposable. The accumulated coating on anode assembly 58 is removed periodically during scheduled maintenance periods by removing the old plate 104 and replacing it with a new plate 104. Preferably, plate 104 is made of the same material as cathode 44, so that both plate 104 and its coating can be recycled. Preferably, plate 104 is fastened to anode 100 using bolts which pass through aligned thru-holes in plate 104 and anode 100. The heads of the bolts are placed on the inward-facing side of anode assembly 58 and the bolts are secured with nuts on the outward-facing side of anode assembly 58, to shield the nuts from becoming coated. Preferably, the bolts, too, are made of the same material as cathode 44, to facilitate recycling.

Figure 4:
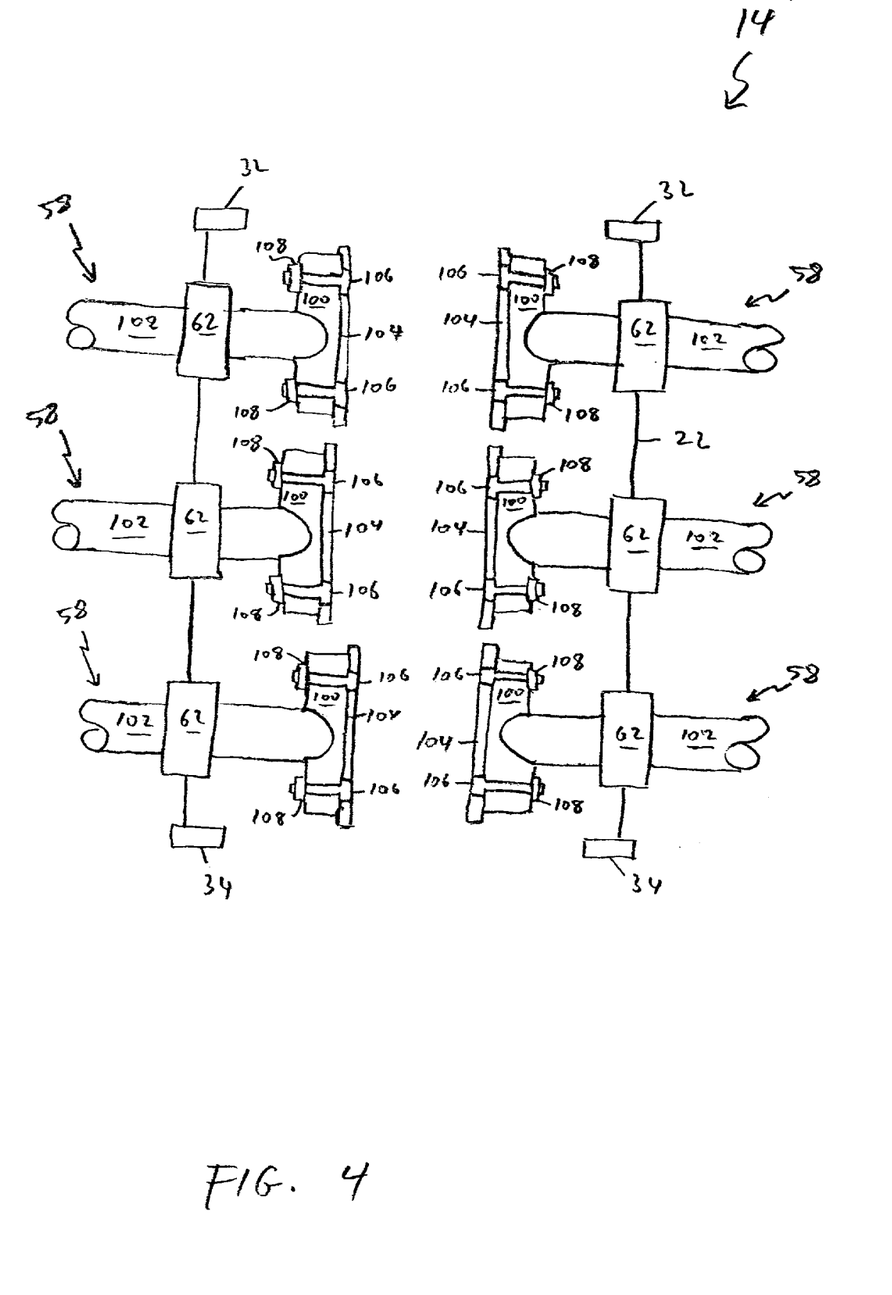
FIG. 4 shows a variant of the anode section of the vacuum arc plasma gun deposition system of FIG. 1.

FIG. 4 illustrates a variant 14' of anode section 14 with six anode assemblies 58, in pairs on either side of the central channel. Parts that are shared by variants 14 and 14' have common reference numerals. In addition, bolts 106 and nuts 108 are shown. In variant 14', the distance of each anode assembly 58 from the plasma flow axis can be adjusted separately in order to control the distribution of electrical currents among anode assemblies 58. Furthermore, each anode assembly 58 can be withdrawn independently, at a rate commensurate with the accumulation of coating material on that anode assembly 58.

In order to control the motion of cathode 44 and anode assemblies 58, it is useful to monitor the cathode erosion and the deposition on anode assemblies 58.

This may be accomplished using an electro-optical system which views the surfaces of cathode 44 and anode assemblies 58 through an observation port (not shown) mounted on anode section housing 22. Preferably, the window is shuttered within the vacuum system in a normally closed position to prevent coating the interior surface of the window, and opened periodically for very short durations to monitor the surfaces of cathode 44 and anode assemblies 58. In one embodiment, light emitted from the arc illuminates the electrode surfaces and a single port is sufficient, while in another embodiment a shadow is cast from an external light source (not shown) mounted outside one shuttered window, while the electro-optical monitor is mounted opposite a second shuttered port, and the two ports are mounted on a common optical axis.

Figure 5:
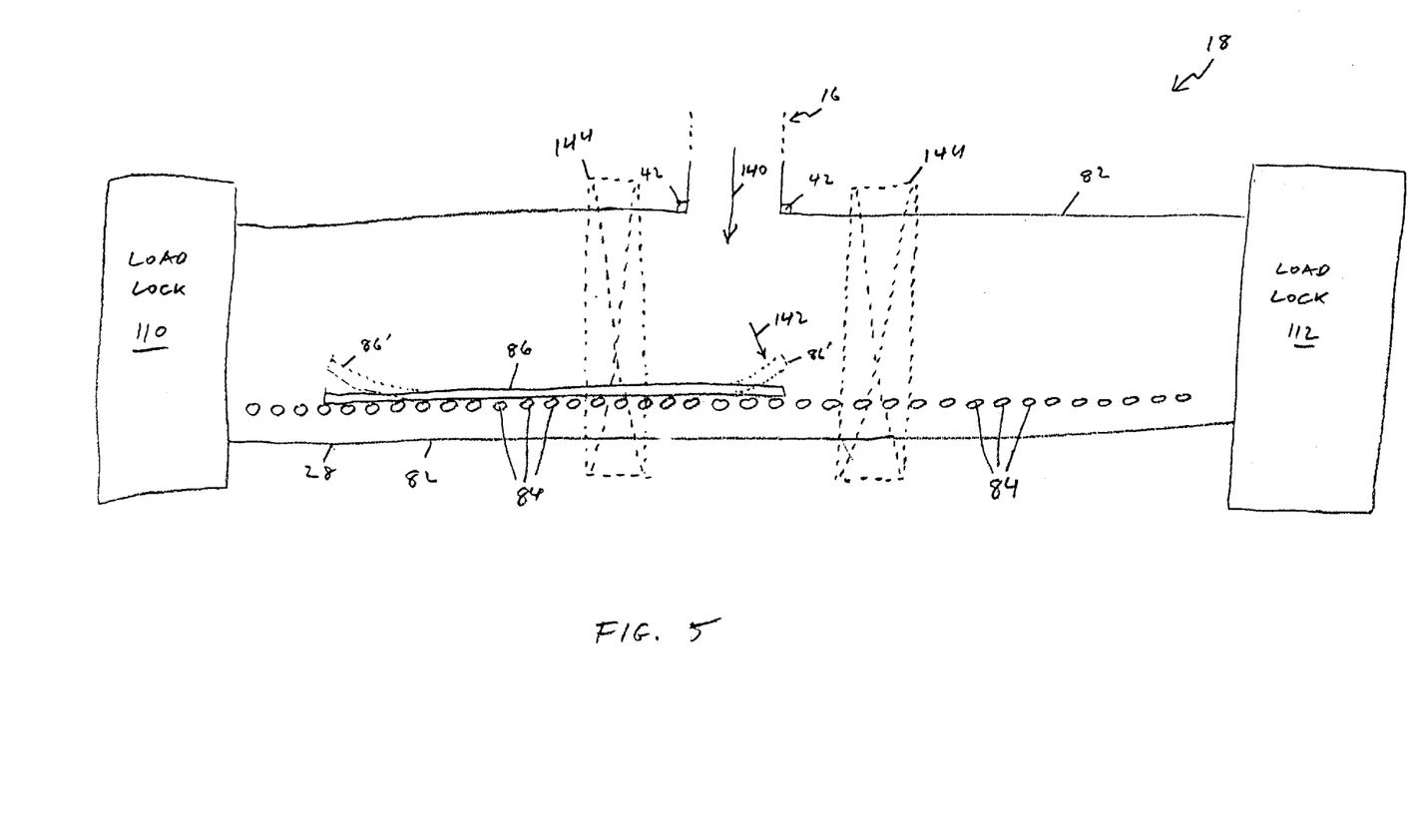
FIG. 5 is a partly schematic illustration of the processing section of the vacuum arc plasma gun deposition system of FIG. 1.

FIG. 5 is a partly schematic illustration of processing section 18, showing how processing section 18 is adapted to the processing of a relatively long, rigid flat workpiece 86. Workpiece 86 is introduced to processing section 18 via a first load lock 110 that allows the introduction of workpiece 86 to vacuum arc plasma gun deposition system 10 without exposing the interior of vacuum arc plasma gun deposition system 10 to atmospheric pressure. Following processing, workpiece 86 is removed from processing section 18 via a second, similar load lock 112 that allows the removal of workpiece 86 to vacuum arc plasma gun deposition system 10 without exposing the interior of vacuum arc plasma gun deposition system 10 to atmospheric pressure.

Also shown in phantom in FIG. 5 are a workpiece 86' that is not flat, for example, automotive glass, and two steering coils 144. Plasma enters processing section 18 in a generally axial direction 140 and so impinges on a flat workpiece 86 substantially perpendicular to the surface of workpiece 86. If workpiece 86 is moved at a constant rate past the plasma, workpiece 86 is coated uniformly. Moving a workpiece 86' that is not flat at a uniform rate past the plasma produces a non-uniform coating, with the thickness of the coating being approximately proportional to the sine of the angle between direction 140 and the surface of workpiece 86'. To compensate for this, steering coils 144 are used to cause the plasma to flow within processing section 18 at an angle to direction 140, i.e., in a direction 142 that is substantially locally perpendicular to the surface of workpiece 86', thereby coating workpiece 86' uniformly. Alternatively, the electrical current provided by current source 98 is varied, approximately proportional to the cosecant of the angle between direction 140 and the surface of workpiece 86', to coat workpiece 86' uniformly. A further alternative is to vary the transport velocity of workpiece 86' in accordance with the angle between direction 140 and the surface of workpiece 86' in a manner that causes workpiece 86' to be coated uniformly.

Figure 6:
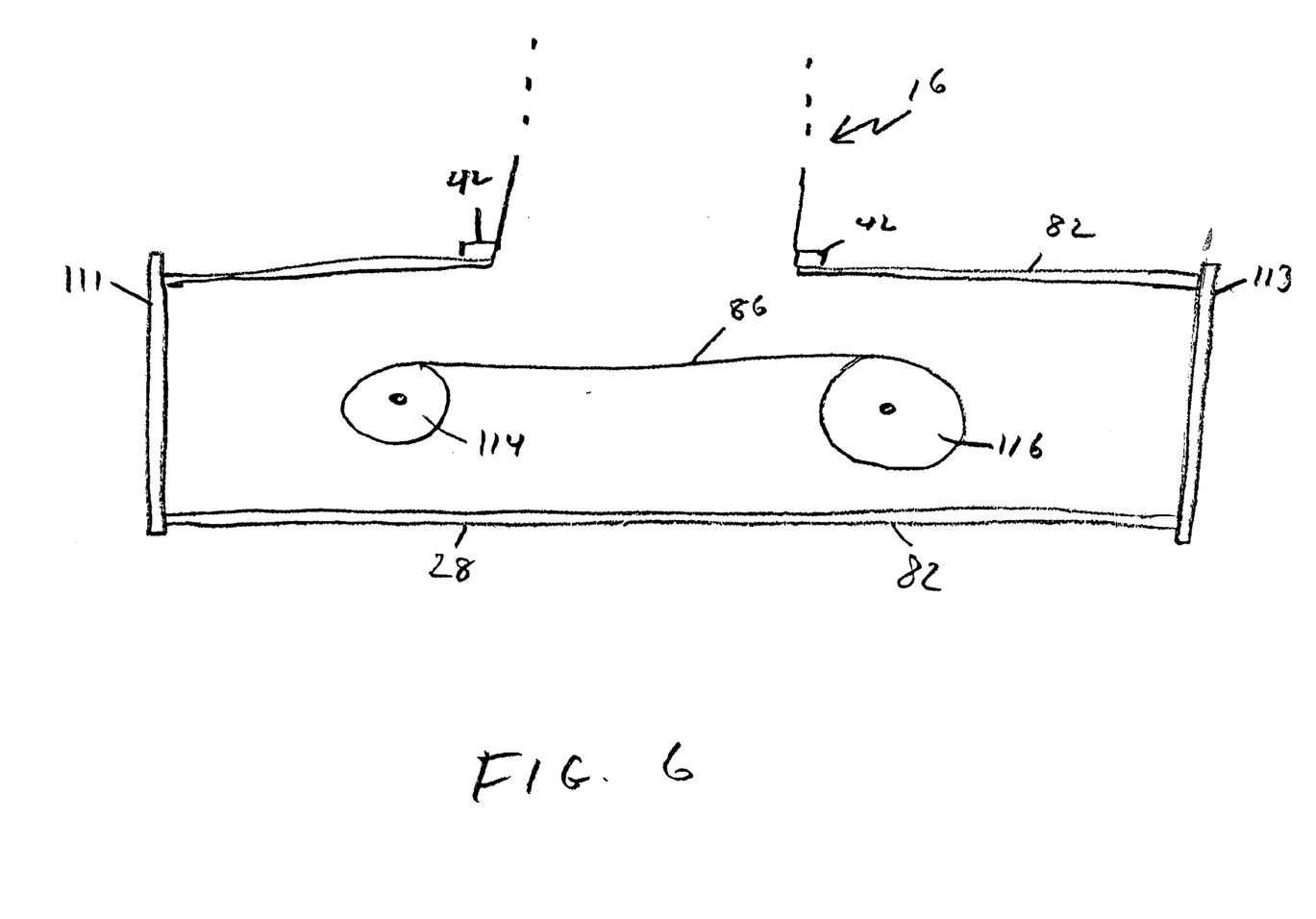
FIG. 6 is a partly schematic illustration of a variant of the processing section of FIG. 5.

FIG. 6 is a partly schematic illustration of a somewhat more compact variant 18' of processing section 18 for processing a flexible workpiece 86. Workpiece 86 is introduced to processing section 18' on a supply reel 114 and is spooled to a take-up reel 116 as plasma is generated. Instead of load locks 110 and 112, variant 18' is provided with vacuum-tight doors 111 and 113. Before a coating run, and before the air is pumped out of vacuum arc plasma gun deposition system 10 to create a vacuum therein, door 111 or door 113 is opened and reels 114 and 116 with uncoated workpiece 86 are introduced to processing section 18'. The relevant door 111 or 113 then is sealed and the air is pumped from vacuum arc plasma gun deposition system 10 to create a vacuum within vacuum arc plasma gun deposition system 10. After the coating run, air is introduced to vacuum arc plasma gun deposition system 10 to equilibrate pressure on both sides of doors 111 and 113, and then door 111 or door 113 is opened and reels 114 and 116 with coated workpiece 86 are removed from processing section 18'. Preferably, flexible workpiece 86 is supported opposite the opening of filter duct section 16 by a cooled surface (not shown), such as a cooled rotating drum, that is in good thermal contact with flexible workpiece 86, for the purpose of removing heat that accumulates in flexible workpiece 86 during the deposition process.

The scope of the present invention includes coated products produced by coating suitable substrates as workpieces 86 in vacuum arc plasma gun deposition system 10. It will be appreciated by those skilled in the art that the coatings that are applied to the substrates by the present invention may be transparent (e.g., $TiO_2$, $SiO_2$), opaque (e.g., $Cu_2O$), partly reflective (e.g., oxides or very thin metallic films), electrically conductive (e.g., metals; semiconductors such as $SnO_{2-x}$ and indium-tin oxide), or metallic (e.g., Al, Ti, Cu). Likewise, multi-layer coatings may be applied wherein multiple sources including sections 12, 14, and 16 are mounted on a common processing section 20. It will likewise be appreciated by those skilled in the art that filter section 16 may be omitted in applications in which the inclusion of macroparticles may be tolerated.

Coated products that fall within the scope of the present invention include coated architectural glass; vehicular windows with transparent, electrically conductive coating defroster elements; vehicular windows with transparent, electrically conducting antenna elements; solar cells; flat panel displays; coated polymer sheets; and metal sheets, for use as solar energy collectors, whose coatings include layers that absorb solar energy.

Two such coated products of particular interest are glass panes for covering solar energy collectors and architectural glass panes.

Figure 7A:
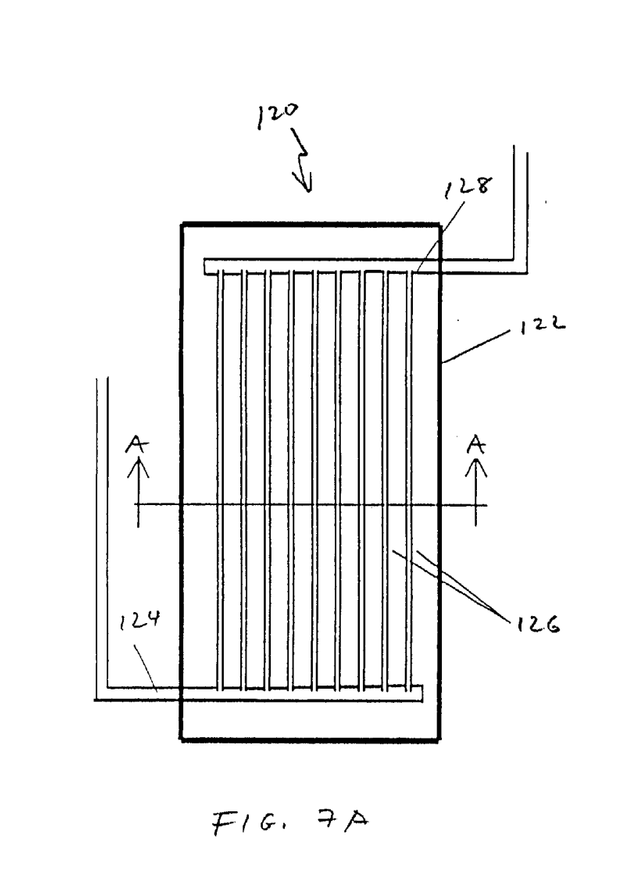
FIGS. 7A and 7B show a solar energy collector whose cover is a coated product of the present invention.
Figure 7B:
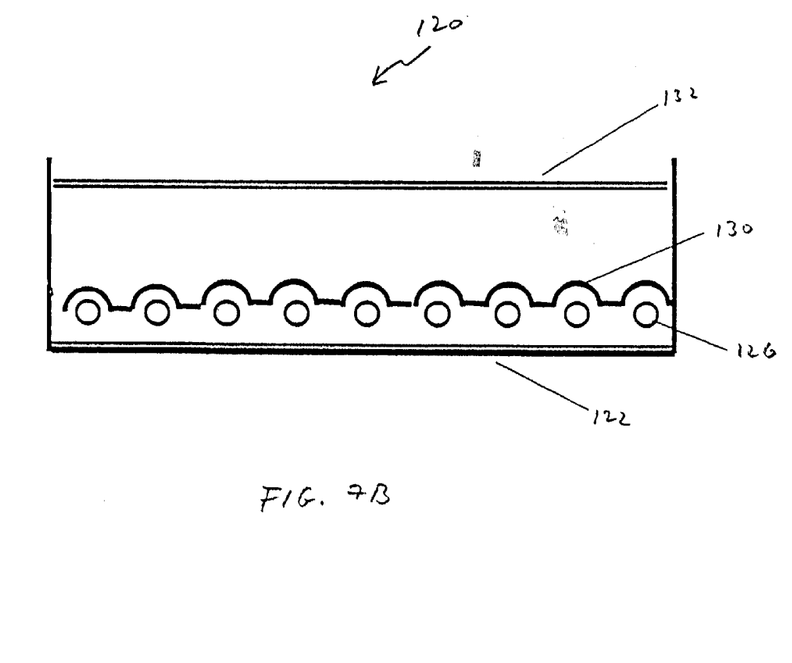

FIGS. 7A and 7B are, respectively, a top view and a side section of a solar energy collector 120 that includes two coated products of the present invention. Solar energy collector 120 is based on a box 122; and FIG. 7B is a cross section through box 122 along cut AA of FIG. 7A. Water enters solar energy collector 120 via an inlet pipe 124, is heated in riser pipes 126 and exits via an outlet pipe 128. Riser pipes 126 are covered by an absorber panel 130 that absorbs solar energy. Box 122 is covered by glass cover 132. Absorber panel 130 and glass cover 132 are the two coated products of the present invention that are included in solar energy collector 120. Absorber panel 130 is coated according to the present invention with a layer of tin oxide and a layer of chromium nitride, having a combined thickness of between 150 nanometers and 200 nanometers, using cathodes 44 made of tin and chromium. Glass cover 132 is coated according to the present invention with a coating that reflects thermal infra-red radiation while being nearly totally transparent to solar radiation (typically visible and near infra-red), so as to allow solar radiation to enter box 122 and heat absorber panel 130 and riser pipes 126, while totally reflecting thermal infrared radiation emitted by absorber panel 130 as a 100° C. (the temperature of boiling water) black body. If a working fluid other than water is used, then the black body temperature of absorber panel 130 is the boiling point of the alternative working fluid, and the properties of glass cover 132 are altered accordingly.

Architectural glass panes of the present invention are so-called "low-E" glass panes, coated with successive layers of titanium oxide and tin oxide, by using cathodes 44 made of titanium and tin.

While the invention has been described with respect to a limited number of embodiments, it will be appreciated that many variations, modifications and other applications of the invention may be made.

What is claimed is:

1. A vacuum arc plasma gun comprising:
   (a) a cathode having an active surface;
   (b) at least one anode;
   (c) a current source for causing electrical current to flow from said at least one anode to said active surface of said cathode; and
   (d) a mechanism for moving said cathode to keep said active surface substantially at a fixed position relative to said at least one anode while said electrical current flows.

2. The vacuum arc plasma gun of claim 1, wherein said active surface is substantially flat with rounded edges.

3. The vacuum arc plasma gun of claim 1, wherein said active surface is substantially flat with chamfered edges.

4. The vacuum arc plasma gun of claim 1, wherein said active surface includes at least two chamfered edges that meet at a point.

5. The vacuum arc plasma gun of claim 1 wherein said mechanism is operative to move said cathode in a substantially axial direction within the vacuum arc plasma gun.

6. A vacuum arc plasma gun comprising:
   (a) a cathode having an active surface and at least one lateral surface;
   (b) at least one anode;
   (c) a current source for causing electrical current to flow from said at least one anode to said active surface of said cathode; and
   (d) a mechanism for cooling said cathode while said electrical current flows, by conducting heat away from said at least one lateral surface.

7. The vacuum arc plasma gun of claim 6, wherein said mechanism for cooling said cathode includes:
   (i) a cooling bar; and
   (ii) a mechanism for reversibly urging said cooling bar against one of said at least one lateral surface.

8. The vacuum arc plasma gun of claim 7, wherein said cooling bar includes a heat sink and a coolant pipe for cooling said heat sink.

9. The vacuum arc plasma gun of claim 7, wherein said cooling bar includes a heat sink and an electrically insulating layer on a side of said heat sink facing said lateral surface whereagainst said cooling bar is reversibly urged.

10. The vacuum arc plasma gun of claim 9, wherein said electrically insulating layer includes a ceramic.

11. The vacuum arc plasma gun of claim 9, wherein said electrically insulating layer includes an elastomer.

12. The vacuum arc plasma gun of claim 7, wherein said cooling bar includes a heat sink and an electrically insulating layer on a side of said heat sink facing said at least one anode.

13. A vacuum arc plasma gun comprising:
    (a) a cathode;
    (b) a plurality of anode assemblies defining a channel having a cross sectional size;
    (c) a current source for causing electrical current to flow from said plurality of anode assemblies to said cathode, thereby causing material to flow away from said cathode via said channel, at least a portion of said material then being deposited on said anode assemblies; and
    (d) for each said anode assembly: a mechanism for moving said each anode assembly to keep said cross sectional size of said channel substantially constant while said material is deposited on said each anode assembly.

14. The vacuum arc plasma gun of claim 13, wherein each said anode assembly includes:
    (i) an anode; and
    (ii) a plate, reversibly secured to said anode and facing said channel, whereon said material is deposited.

15. The vacuum arc plasma gun of claim 14, wherein said cathode and said plates have substantially identical compositions.

16. The vacuum arc plasma gun of claim 13, wherein each said anode assembly includes:
    (i) an anode; and
    (ii) a coolant pipe for cooling said anode.

17. The vacuum arc plasma gun of claim 13, wherein the cathode has an active surface, the vacuum arc plasma gun further comprising:
    (e) a mechanism for moving said cathode to keep said active surface substantially at a fixed position relative to said anode assemblies while said electrical current flows.

18. A method of coating a substrate, comprising the steps of:
    (a) providing a vacuum arc plasma gun including:
        (i) a cathode having an active surface, and
        (ii) at least one anode;
    (b) causing an electrical current to flow from said at least one anode to said active surface of said cathode, thereby creating a plasma that carries coating material away from said active surface of said cathode; and
    (c) while said electrical current flows:
        (i) positioning said substrate relative to said plasma so that at least a portion of said coating material is deposited on said substrate, and
        (ii) moving said cathode so that said active surface remains substantially in a fixed position relative to said at least one anode.

19. The method of claim 18, wherein said electrical current is caused to flow continuously for at least about 24 hours.

20. The method of claim 18, wherein said electrical current is caused to flow continuously for at least about two weeks.

21. A method of coating a substrate, comprising:
    (a) providing a vacuum arc plasma gun including:
        (i) a cathode having an active surface and a lateral surface, and
        (ii) at least one anode;
    (b) causing an electrical current to flow from said at least one anode to said active surface of said cathode, thereby creating a plasma that carries coating material away from said active surface of said cathode; and
    (c) while said electrical current flows:
        (i) positioning said substrate relative to said plasma so that at least a portion of said coating material is deposited on said substrate, and
        (ii) removing heat from said cathode by conduction via said lateral surface.

22. A method of coating a substrate comprising:
    (a) providing a vacuum arc plasma gun including:
        (i) a cathode, and
        (ii) a plurality of anode assemblies defining a channel having a cross sectional size;
    (b) causing an electrical current to flow from said anode assemblies to said cathode, thereby creating a plasma that carries coating material away from said cathode via said channel, a first portion of said coating material being deposited on said mode assemblies; and (c) while said electrical current flows:
- (i) positioning said substrate relative to said plasma so that a second portion of said coating material is deposited on said substrate, and
- (ii) moving said anode assemblies to keep said cross sectional size of said channel substantially constant while said first portion of said coating material is deposited on said anode assemblies.

23. The method of claim 22, further comprising the step of:
- (d) while said electrical current flows, moving said cathode to keep an active surface of said cathode substantially at a fixed position relative to said anode assemblies.

24. A vacuum arc plasma gun deposition system for coating a substrate, comprising:
- (a) a cathode;
- (b) at least one anode;
- (c) a current source for causing electrical current to flow from said at least one anode to said cathode, thereby forming a plasma that flows in a generally axial direction; and
- (d) a processing section including:
  - (i) a mechanism for moving the substrate substantially perpendicular to said generally axial direction, and
  - (ii) a mechanism for steering said plasma to flow at an angle to said generally axial direction within said processing section.

25. The vacuum arc plasma gun deposition system of claim 24, wherein said mechanism for steering said plasma includes at least one coil.

26. A method of coating a substrate, comprising:
- (a) providing a vacuum arc plasma gun including:
  - (i) a cathode,
  - (ii) at least one anode, and
  - (iii) a processing section;
- (b) causing an electrical current to flow from said at least one anode to said cathode, thereby creating a plasma that flows into said processing section in a generally axial direction; and
- (c) while the electrical current flows:
  - (i) moving the substrate within said processing section in a direction substantially perpendicular to said generally axial direction; and
  - (ii) steering the plasma in the processing section to impinge on said substrate at an angle to said generally axial direction.

* * * * *